United States Patent
Kasai

(10) Patent No.: US 7,397,449 B2
(45) Date of Patent: Jul. 8, 2008

(54) CURRENT GENERATION CIRCUIT, METHOD OF DRIVING CURRENT GENERATION CIRCUIT, ELECTRO-OPTICAL DEVICE, AND ELECTRONIC DEVICE

(75) Inventor: Toshiyuki Kasai, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 615 days.

(21) Appl. No.: 10/930,913

(22) Filed: Sep. 1, 2004

(65) Prior Publication Data

US 2005/0140601 A1    Jun. 30, 2005

(30) Foreign Application Priority Data

Nov. 21, 2003    (JP)    ............... 2003-392180

(51) Int. Cl.
  G09G 3/30    (2006.01)
  G09G 5/00    (2006.01)
  G06F 3/038    (2006.01)
(52) U.S. Cl. ......................................... 345/76; 345/212
(58) Field of Classification Search ............. 345/76–80, 345/211–213
  See application file for complete search history.

(56) References Cited

U.S. PATENT DOCUMENTS

| 6,501,466 | B1 | 12/2002 | Yamagishi et al. |
| 6,765,560 | B1 | 7/2004 | Ozawa |
| 7,109,953 | B2 * | 9/2006 | Abe et al. ....................... 345/76 |
| 7,180,479 | B2 | 2/2007 | Kimura |
| 2003/0030602 | A1 | 2/2003 | Kasai |
| 2005/0024352 | A1 | 2/2005 | Sano |
| 2006/0119552 | A1 | 6/2006 | Yumoto |

FOREIGN PATENT DOCUMENTS

| JP | A 2000-105574 | 4/2000 |
| JP | A 2000-122608 | 4/2000 |
| JP | A-2001-147659 | 5/2001 |
| JP | A-2002-514320 | 5/2002 |
| JP | A-2003-114645 | 4/2003 |
| JP | A 2003-195815 | 7/2003 |
| JP | A 2005-010683 | 1/2005 |
| WO | WO 98/48403 | 10/1998 |
| WO | WO 03/038795 A1 | 5/2003 |

\* cited by examiner

*Primary Examiner*—Bipin Shalwala
*Assistant Examiner*—Steven Holton
(74) *Attorney, Agent, or Firm*—Oliff & Berridge, PLC

(57) ABSTRACT

To suppress variations of data currents dependent on a threshold voltage Vth of driving elements which form a current generation circuit. A current output section 41a has circuit systems in which a driving element DR and a switching element SW are connected in series, the number of the circuit systems corresponding to the number of the bits of input data. Each gate of the driving elements DR is commonly connected to a first node N1. The current output section 41a outputs data current Idata such that electrical currents flowing through each channel of the driving elements DR are merged in a state in which the voltage V1 of the node N1 of the node is set to a driving voltage. A gate voltage generation section 41b sets the voltage V1 of the node N1 to an offset voltage corresponding to Vth by diode-connecting at least one of the driving elements DR. Also, the current output section 41 a sets the voltage V1 to a driving voltage, in which the offset voltage is used as a reference, by varying a voltage Vref supplied to a terminal which is capacitively coupled to the node N1.

6 Claims, 5 Drawing Sheets

CURRENT GENERATION CIRCUIT, METHOD OF DRIVING CURRENT GENERATION CIRCUIT, ELECTRO-OPTICAL DEVICE, AND ELECTRONIC DEVICE

BACKGROUND OF THE INVENTION

1. Field of Invention

The present invention relates to a current generation circuit, a method of driving the current generation circuit, an electro-optical device, and an electronic device. More particularly, the present invention relates to Vth compensation of a driving element which forms a portion of the current generation circuit.

2. Description of Related Art

For example, in Patent Document 1, a current generation circuit in which data current is generated in accordance with digital data which is input data (see FIG. 6 of Patent Document 1) is disclosed. The current generation circuit provided for each data line has circuit systems in which a driving element and a switching element are connected in series, the number of the circuit systems corresponding to the number of the bits of the input data. The gain coefficients of the respective driving elements are set to values corresponding to the weights of the corresponding bits, for example, as 1:2:4:8:16:32 in the case of 6-bit data. Furthermore, the respective switching elements are conduction controlled in accordance with the content of the corresponding bits. The data current is generated in accordance with the content of the input data and corresponds to the total sum of the electrical currents flowing through the channels of the respective driving elements. The generated data current is supplied to the. pixel containing an organic EL element through the data line.

[Patent Document 1] Japanese Unexamined Patent Application Publication No. 2003-114645

SUMMARY OF THE INVENTION

Currently, in actual products, it is very difficult to completely make the same threshold voltages (hereinafter referred to as "Vth") of each driving element contained in the current generation circuit due to influences of disturbance factors, such as manufacture variations and deterioration over time, and a certain degree of variations exists. For this reason, regarding the output characteristics of data current in the current generation circuit, variations dependent on Vth, that is, Vth dependency, occur. As a result, when the same gradation is displayed, the data current output from each current generation circuit varies, and variations occur in the display gradation of each pixel.

The present invention has been made in view of such circumstances. An object of the present invention is to suppress variations of data currents dependent on Vth of driving elements which form a current generation circuit.

To solve such problems, a first aspect of the present invention provides a current generation circuit including a current output section and a gate voltage generation section. The current output section has circuit systems in which a driving element having a gain coefficient corresponding to the weight of the bits of input data and a switching element which is on-off controlled according to the content of the bits are connected in series, the number of the circuit systems corresponding to the number of the bits of the input data. The respective gates of the driving elements are commonly connected to a predetermined node. The current output section outputs data current such that electrical currents flowing through the respective channels of the driving elements are merged in a state in which the voltage of the node is set to a driving voltage. The gate voltage generation section sets the voltage of the node to an offset voltage corresponding to a threshold voltage of the driving element by diode-connecting at least one of the driving elements. Also, the gate voltage generation section sets the voltage of the node to a driving voltage in which the offset voltage is used as a reference by varying the voltage supplied to another terminal of capacitor whose terminal is connected to said node.

Here, in a first aspect of the present invention, preferably, the gate voltage generation section includes a first transistor, provided between the node and one of the terminals of the driving elements, the first transistor being on-off controlled for diode-connecting the driving element. In this case, one of the terminals of the first transistor may be connected to the node, and the other terminal of the first transistor may be connected to the junction point of one of the terminals of the driving element and one of the terminals of the switching element in one of the circuit systems. Furthermore, one of the terminals of the first transistor may be connected to the node, and the other terminal of the first transistor may be connected commonly to each one of the terminals of the driving elements in a plurality of the circuit systems via the switching elements provided so as to correspond to the respective driving elements.

Furthermore, in the first aspect of the present invention, the gate voltage generation section may further include a second transistor, which is provided between the node and a terminal to which an initial voltage having a voltage level higher than a threshold voltage is supplied. The second transistor is turned on before the offset voltage is set.

Furthermore, in the first aspect of the present invention, the gate voltage generation section may include a capacitor, connected to the node, for holding the voltage of the node.

In a second aspect of the present invention, there is provided an electro-optical device including: a plurality of scanning lines; a plurality of data lines; a display section; a scanning-line driving circuit; and a data-line driving circuit. Here, the display section is composed of a plurality of pixels provided so as to correspond to the intersections of the scanning lines and the data lines. Each of the plurality of pixels includes a capacitor in which data corresponding to data current is written; a transistor for setting driving current corresponding to the data held in the capacitor; and an electro-optical element which is set to luminance corresponding to the driving current. The scanning-line driving circuit selects the scanning line corresponding to the pixel to which data is to be written by outputting a scanning signal to the scanning line. The data-line driving circuit cooperates with the scanning-line driving circuit so as to output the data current to the data line corresponding to the pixel to which data is to be written. In the data-line driving circuit, the current generation circuit according to the first aspect of the present invention is incorporated.

In a third aspect of the present invention, there is provided an electronic device incorporating an electro-optical device according to the second aspect of the present invention.

In a fourth aspect of the present invention, there is provided a method of driving a current generation circuit, the method including: a first step in which the voltage of a node connected to the gate of a driving element is set to an offset voltage corresponding to a threshold voltage of the driving element by diode-connecting at least one of a plurality of driving elements having a gain coefficient corresponding to the weight of the bits of input data; a second step in which the voltage of the node is set to a driving voltage in which the offset voltage is used as a reference by varying the voltage supplied to another terminal of capacitor whose terminal is connected to said node ; and a third step in which data current such that electrical currents flowing through the respective channels of the driving elements are merged in a state in which the voltage of the node is set to the driving voltage is output.

Here, in the fourth aspect of the present invention, preferably, the first step includes a step of turning on a transistor provided between the node and one of the terminals of the driving elements.

In the fourth aspect of the present invention, there may be further provided a fourth step of setting the voltage of the node to an initial voltage having a voltage level higher than the threshold voltage of the driving element before the voltage of the node is set to the offset voltage.

[Advantages]

According to the present invention, the voltage of the node which is connected commonly to the gates of the driving elements is set in advance to an offset voltage. Then, the driving voltage which is set by using the offset voltage as a reference is supplied to the gate of the driving element, causing the driving element to be driven. As a result, when data current is to be generated by the driving element, since Vth dependency of the data current is reduced, it becomes possible to suppress variations of the data current.

DETAILED DESCRIPTION OF PREFERRED EMBODIMENTS

First Embodiment

Figure 1:
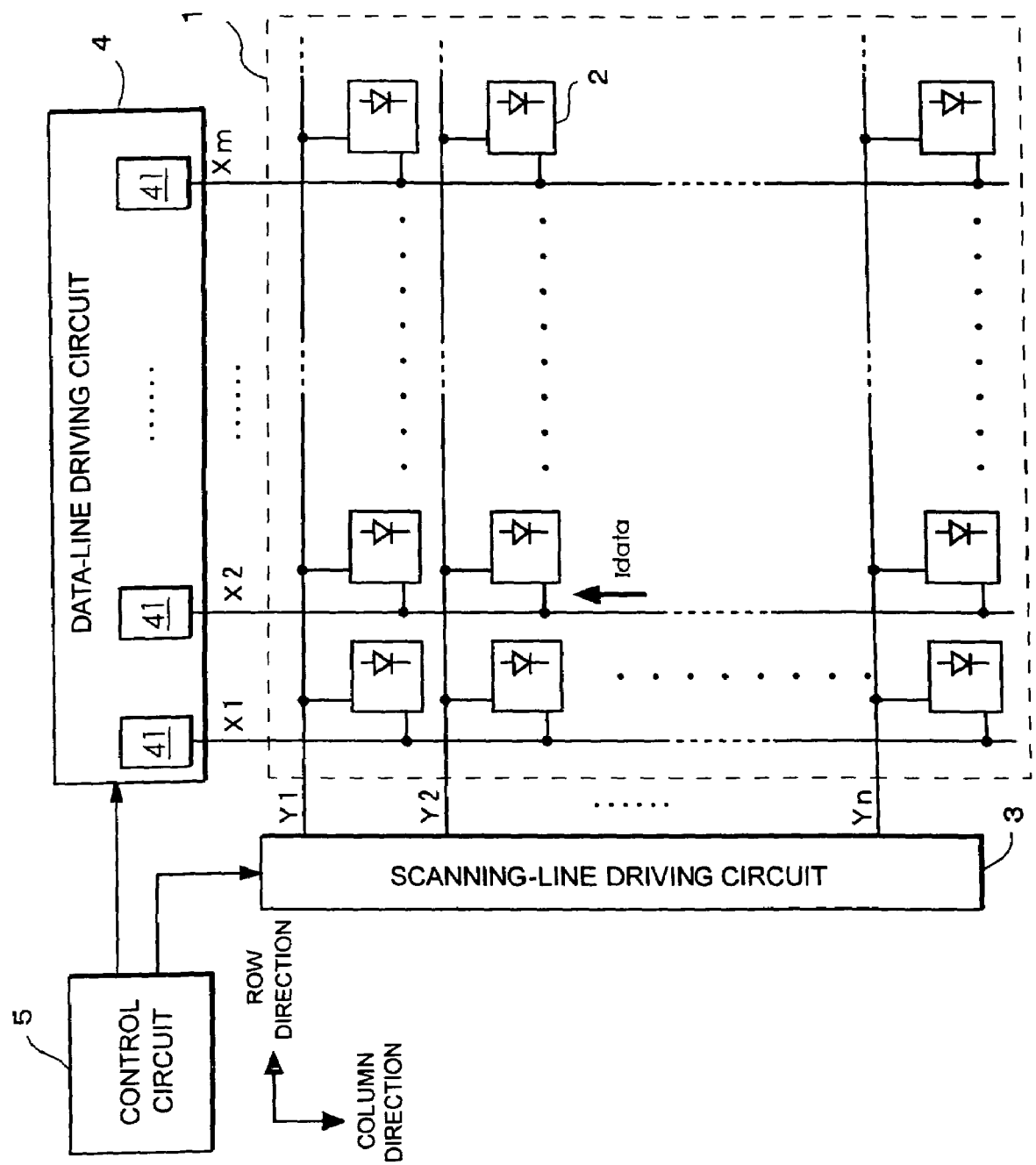
FIG. 1 is a block diagram of an electro-optical device.

FIG. 1 is a block diagram of an electro-optical device according to this embodiment. A display section 1 is, for example, an active-matrix-type display panel for driving electro-optical elements by TFTs (Thin-Film Transistors). In this display section 1, a group of pixels of m dots×n lines are arranged in a matrix (in the manner of a two-dimensional plane). In the display section 1, a group of scanning lines Y1 to Yn, each of which extends in the horizontal direction, and a group of data lines X1 to Xm, each of which extends in the vertical direction are provided, and a pixel 2 is arranged in such a manner as to correspond to the intersection thereof.

The pixel 2 has the configuration of a pixel circuit of a current program method, and basically includes an organic EL element, a capacitor, a driving transistor, and a programming transistor (not required when the driving transistor also serves the function of the driving transistor). The organic EL element is a typical current-driven-type electro-optical element whose luminance is set by the driving current flowing therethrough. The programming transistor generates a gate voltage corresponding to data current Idata supplied to the data line X, and writes data into the capacitor in accordance with this voltage. The driving transistor, whose gate is connected to the capacitor, causes driving current corresponding to the data held in the capacitor to flow to its own channel. Then, as a result of the driving current flowing through the organic EL element, the organic EL element emits light, and the gradation of the pixel 2 is set. For the specific circuit configuration of such a pixel 2, various configurations have been proposed. For example, a pixel circuit (Japanese Unexamined Patent Application Publication No. 2003-114645) in which the driving transistor also serves the function of the programming transistor, a pixel circuit (Japanese Unexamined Patent Application Publication No. 2001-147659) in which the driving transistor and the programming transistor form a current mirror circuit, and a pixel circuit (PCT Japanese Translation Patent Publication No. 2002-514320) for generating driving current with Vth compensation of the driving transistor are known.

A control circuit 5 synchronously controls a scanning-line driving circuit 3 and a data-line driving circuit 4 in accordance with a vertical synchronization signal Vs, a horizontal synchronization signal Hs, a dot clock signal DCLK, gradation data D, etc., which are input from a host apparatus (not shown). Under the synchronous control, the driving circuits 3 and 4 cooperate with each other so as to perform display control of the display section 1.

The scanning-line driving circuit 3 is mainly formed of a shift register, an output circuit, etc., and performs line sequential scanning of the scanning lines Y1 to Yn by outputting a scanning signal SEL to the scanning lines Y1 to Yn. The scanning signal SEL takes a binary signal level of a high potential level (hereinafter referred to as an "H level") or a low potential level (hereinafter referred to as an "L level"). The scanning line Y corresponding to a pixel row to which data is to be written is set to an H level, and the other scanning lines Y are set to an L level. The scanning-line driving circuit 3 performs, for each period (1F) in which an image of one frame is displayed, line sequential scanning for sequentially selecting the scanning lines Y in a predetermined selection sequence (generally from the topmost toward the bottommost).

The data-line driving circuit 4 is mainly formed of a shift register, a line latch circuit, an output circuit, etc. Due to the relation of adopting the current program method. Furthermore, the data-line driving circuit 4 includes a current generation circuit 41 as a variable current source (current DAC) for variably generating data current Idata on the basis of data that specifies the display gradation of the pixel 2. In one horizontal scanning period (1H) corresponding to a period in which one scanning line Y is selected, data-line driving circuit 4 simultaneously performs simultaneous output of the data current Idata to the pixel row to which data is to be written this time, and point sequential latch of data on the pixel row to which data is to be written at the next 1H. At a particular 1H, m pieces of data corresponding to the number of data lines X are latched in sequence. Then, at the next 1H, the m pieces of latched data (digital data) are converted into data current Idata (analog data) at the current generation circuit 41, after which the data is output simultaneously to the corresponding data lines X1 to Xm.

Figure 2:
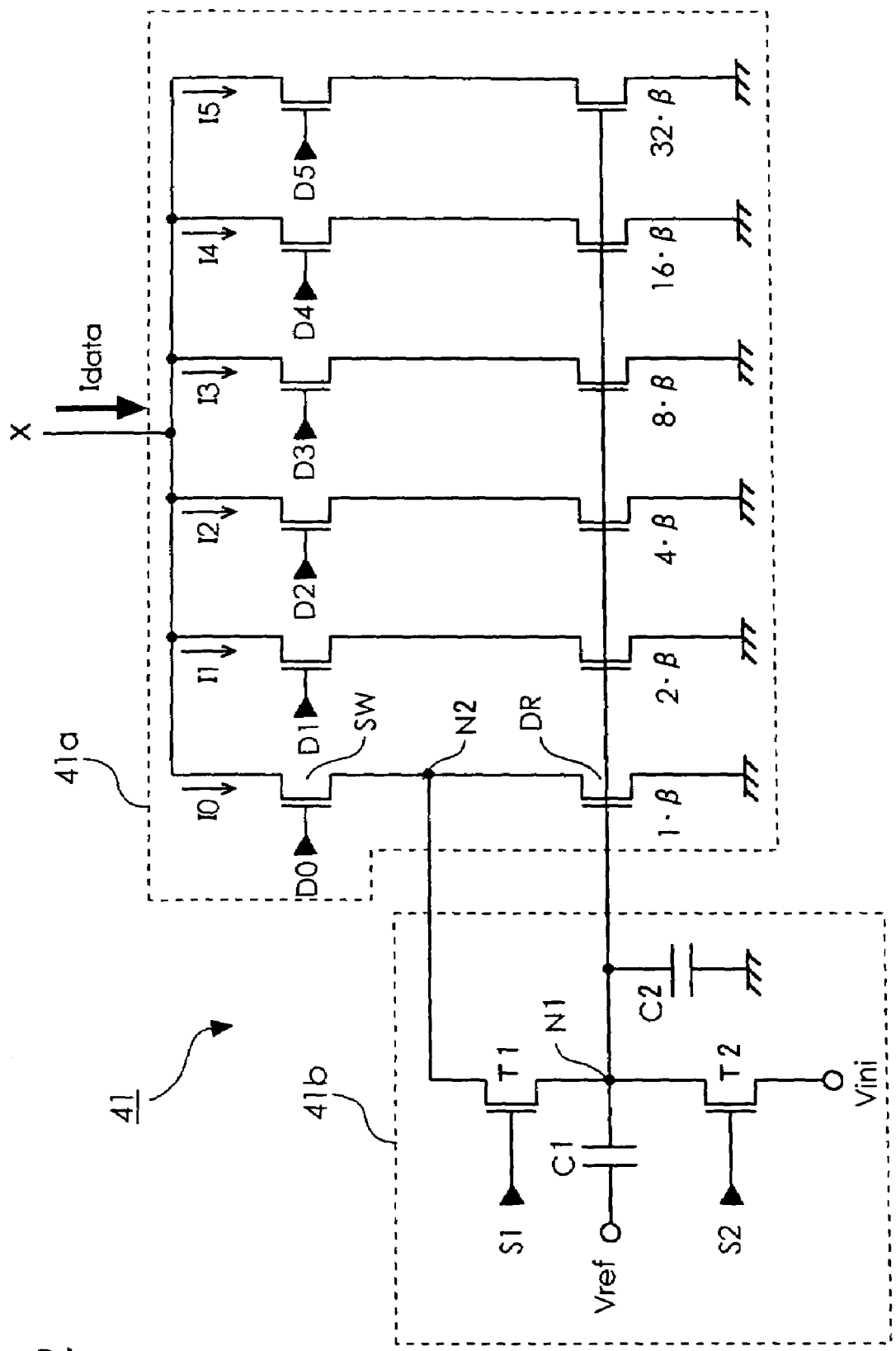
FIG. 2 is a circuit diagram of a current generation circuit according to a first embodiment.

FIG. 2 is a circuit diagram of the current generation circuit 41 according to this embodiment. The current generation circuit 41 has a configuration in which a current output section 41a for generating data current Idata to be supplied to the pixel 2 to which data is to be written is a main unit, to which is added a gate voltage generation section 41b. In this specification, regarding a transistor, which is a three-terminal-type element having a source, a drain, and a gate, one of the source and the drain is called "one of the terminals", and the other is called "the other terminal".

The current output section 41a is provided between the data line X and a reference voltage Vss, and has circuit systems in which a switching element SW and a driving element DR are connected in series, the number (six in this embodiment) of the circuit systems corresponding to the number of the bits of input data D0 to D5. Each driving element DR functions as a constant current source for causing electrical current corresponding to its own gain coefficient β to flow to the channel, and the gates are connected commonly to a node N1. The ratio of the gain coefficients β of the driving elements DR is set as 1:2:4:8:16:32 in such a manner as to correspond to the weights of the 6 bits which form the data D0 to D5 which specify the gradation of the pixel 2. Although such setting of the gain coefficients may be realized in such a way that one driving element DR is formed by a single transistor and the gain coefficients of each transistor are made different, the setting may also be realized in such a way that a plurality of unit transistors having the same gain coefficient are connected in series or in parallel.

The gate voltage generation section 41b is formed of two capacitors C1 and C2 and two transistors T1 and T2. One of the electrodes of the first capacitor C1 is connected to a terminal to which a reference voltage Vref whose voltage level is set variably is supplied, and the other electrode is connected to the first node N1 which is connected commonly to the gates of all the driving elements DR. Also connected commonly to this first node N1 are one of the electrodes of the second capacitor C2, one of the terminals of the first transistor T1 which is conduction controlled in accordance with a first control signal S1, and one of the terminals of the second transistor T2 which is conduction controlled in accordance with a second control signal S2. The reference voltage Vss is supplied to the other electrode of the second capacitor C2. The other terminal of the first transistor T1 is connected to a second node N2. This node N2 corresponds to the connection end of one of the terminals of the driving element DR and one of the terminals of the switching element SW in the circuit system of the least significant bit (LSB) D0. Furthermore, an initial voltage Vini having a voltage level higher than the threshold voltage Vth of the driving element DR which forms a portion of the current output section 41a is supplied to the other terminal of the second transistor T2.

Figure 3:
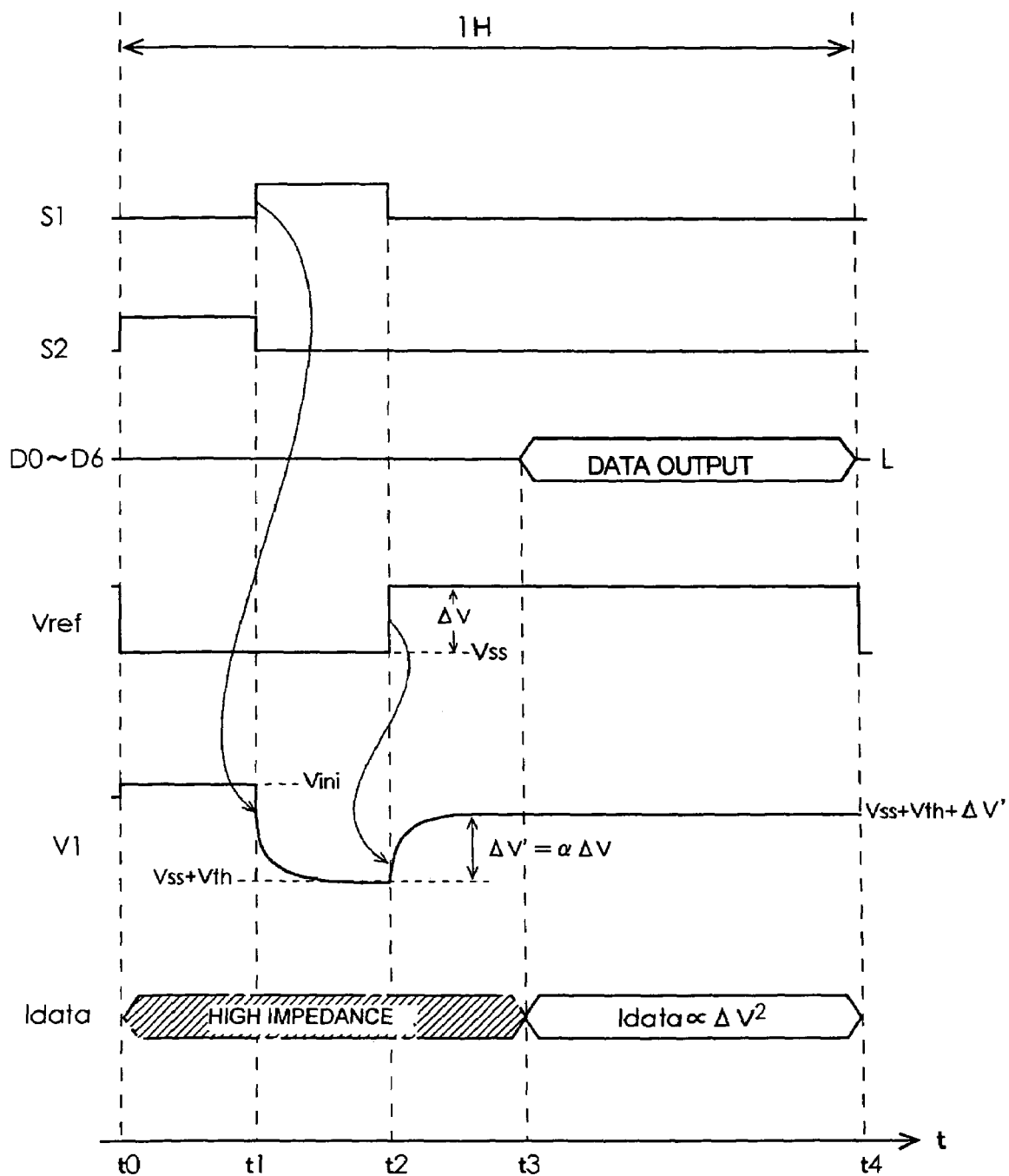
FIG. 3 is an operation timing chart of the current generation circuit according to the first embodiment.

FIG. 3 is an operation timing chart of the current generation circuit 41 shown in FIG. 2. A series of operation processes in the period of t0 to t4 corresponding to 1F described above are broadly classified into an initialization process in the first period of t0 to t1, an offset voltage setting process in the subsequent period of t1 to t2, a driving voltage setting process in the subsequent period of t2 to t3, and a data output process in the final period of t3 to t4. In this embodiment, in the period of t1 to t3, the data D0 to D5 is set to an L level regardless of the content thereof. As a result, in the period of t0 to t3, all the switching elements SW are simultaneously turned off, and the output of the current generation circuit 41 is set to a high impedance state.

First, in the initialization period of t0 to t1, the voltage V1 of the first node N1 is set to the initial voltage Vini. In this period of t0 to t1, since the first control signal S1 is at an L level, the first transistor T1 is kept off. However, the second control signal S2 rises to an H level, causing the second transistor T2 to be turned on. As a result, the capacitors C1 and C2 connected to the node N1, etc., are charged by the initial voltage Vini supplied to the other terminal of the second transistor T2, and the voltage V1 is set to the initial voltage Vini higher than Vth of the driving element DR. When the operation during the offset voltage setting period of t1 to t2 (to be described later) is considered, it is preferable that the initial voltage Vini be set to the offset voltage (Vss+Vth). Although this initialization process may be omitted theoretically, when this process is provided, in the next offset voltage setting process, it becomes possible to reliably turn on the driving element DR.

Next, in the offset voltage setting period of t1 to t2, the voltage V1 of the first node N1 is set to an offset voltage (Vss+Vth) corresponding to Vth of the driving element DR. First, the second control signal S2 falls to an L level, causing the second transistor T2 to be turned off. Then, the first control signal S1 rises to an H level in "synchronization" with the fall of the second control signal S2, and the first transistor T1 is turned on. in this specification, the term "synchronization" is used to mean not only the case of the same timing, but also to mean that a time-related offset is permitted for reasons of tolerance in design. As a result, the first node N1 and the supply end of the initial voltage Vini are electrically separated from each other, and also, the driving element DR is diode-connected such that its gate and its drain are electrically connected to each other via the first transistor T1. On the condition that the driving element DR is turned on, a part of the charge stored in the capacitors C1 and C2 is discharged to the reference voltage Vss side through a passage formed by three circuit elements T1, SW, and DR (the SW and DR are the circuit system of bit D0). As a result, the voltage V1 of the node N1 is forcedly set to the voltage at which the discharge of the charge from the initial voltage Vini which is set in advance is stopped, that is, the offset voltage (Vss+Vth). This offset voltage (Vss+Vth) is uniquely specified in accordance with the threshold voltage Vth of the driving element DR in the circuit system of bit D0.

In the subsequent driving voltage setting period of t2 to t3, the voltage V1 of the first node N1 is set to a driving voltage (Vss+Vth+ΔV') in which the offset voltage (Vss+Vth) is used as a reference. More specifically, the first control signal S1 falls to the L level, causing the first transistor T1 to be turned off. Also, in synchronization with this fall, the reference voltage Vref varies (increases) by ΔV by using the reference voltage Vss as a reference. Here, the supply end of the reference voltage Vref and the node N1 are capacitively coupled via the first capacitor C1. Consequently, as shown in equation 1, the voltage V1 of the node N1 varies by using the offset voltage (Vss+Vth) as a reference, and the amount of the variation becomes α·ΔV in accordance with the amount of the voltage variation ΔV of the reference voltage Vref. The coefficient α is a coefficient (α=Ca/(Ca+Cb)) which is uniquely specified by the capacitance ratio of the capacitance Ca of the first capacitor C1 and the capacitance Cb of the second capacitor C2. In the capacitors C1 and C2, charge corresponding to the driving voltage (Vss+Vth+ΔV') is held.

$$V1 = Vss + Vth + \Delta V' \qquad \text{(Equation 1)}$$
$$= Vss + Vth + \alpha \cdot \Delta V$$

Finally, in the data output period of t3 to t4, in a state in which the driving voltage (Vss+Vth+ΔV') is applied to the gate of the driving element DR, the original data D0 to D5 is output, and data current Idata is generated. More specifically, the data D0 to D5 which is set to an L level is changed to either the H level or the L level according to the content thereof at timing t3. As a result, the conduction state of each switching element SW is set to either ON or OFF according to the content of the corresponding bits. Then, with respect to the driving element DR corresponding to the switching element SW which is turned on, channel current corresponding to its own gain coefficient □ flows through the channel. The data current Idata supplied to the data line X is such that channel currents I0 to I5 flowing through the respective driving elements DR are merged, and the current level corresponds to the value of the total sum of them.

Here, on the assumption that the driving element DR operates in a saturated area, the channel current Ids (=I0) flowing through the driving element DR is computed on the basis of equation 2. In equation 2, Vgs indicates a gate-source voltage of the driving element DR. The gain coefficient β is a coefficient which is uniquely specified by the mobility μ of carriers of the driving element DR, the gate capacitance A, the channel width W, and the channel length L(β=μAW/L).

$$Ids = \beta/2(Vgs - Vth)^2 \quad \text{(Equation 2)}$$

By substituting V1 computed by equation 1 in the gate voltage Vg of the driving element DR, equation 2 can be modified as equation 3.

$$Ids = \beta/2(Vg - Vs - Vth)^2 \quad \text{(Equation 3)}$$
$$= \beta/2\{(Vss + Vth + \alpha \cdot \Delta V) - Vss - Vth\}^2$$
$$= \beta/2(\alpha \cdot \Delta V)^2$$

The point to be noted in equation 3 is that the channel current Ids of the driving element DR does not depend on Vth due to the offset of Vth and is proportional to only the amount of the voltage variation $\Delta V$ (Ids $\propto \Delta V^2$). Therefore, if the driving voltage (Vss+Vth+$\Delta V'$) is set by using Vth as a reference, even if Vth of the driving element DR varies due to manufacture variations, change over time, etc., the channel current Ids can be generated without being affected by the variations.

As described above, according to the present invention, the voltage V1 of the first node N1 which is commonly connected to the gates of the driving elements DR is set in advance to the offset voltage (Vss+Vth), and the driving voltage (Vss+Vth+$\Delta V'$) which is set by using the offset voltage as a reference is supplied to the gate of the driving element DR. As a result, when the data current Idata is generated by the driving of the driving element DR, since Vth dependency of the data current Idata is decreased, variations of the data current Idata can be suppressed. As a result, when the same gradation is displayed, the data current Idata output from each current generation circuit 41 provided for each data line can be made uniform, the display quality can be improved. In this embodiment, it is assumed that all the driving elements DR contained in the current generation circuit 41 are arranged close to each other, and thus there are hardly variations of Vth of them.

In this embodiment, a description is given of an example in which the connection destination of the other terminal of the first transistor T1 is one of the terminals of the driving element DR in the circuit system of the least significant bit D0. Alternatively, this connection destination need not be the circuit system of the bit D0 and may be one of the circuit systems of the higher-order bits D1 to D5.

Second Embodiment

Figure 4:
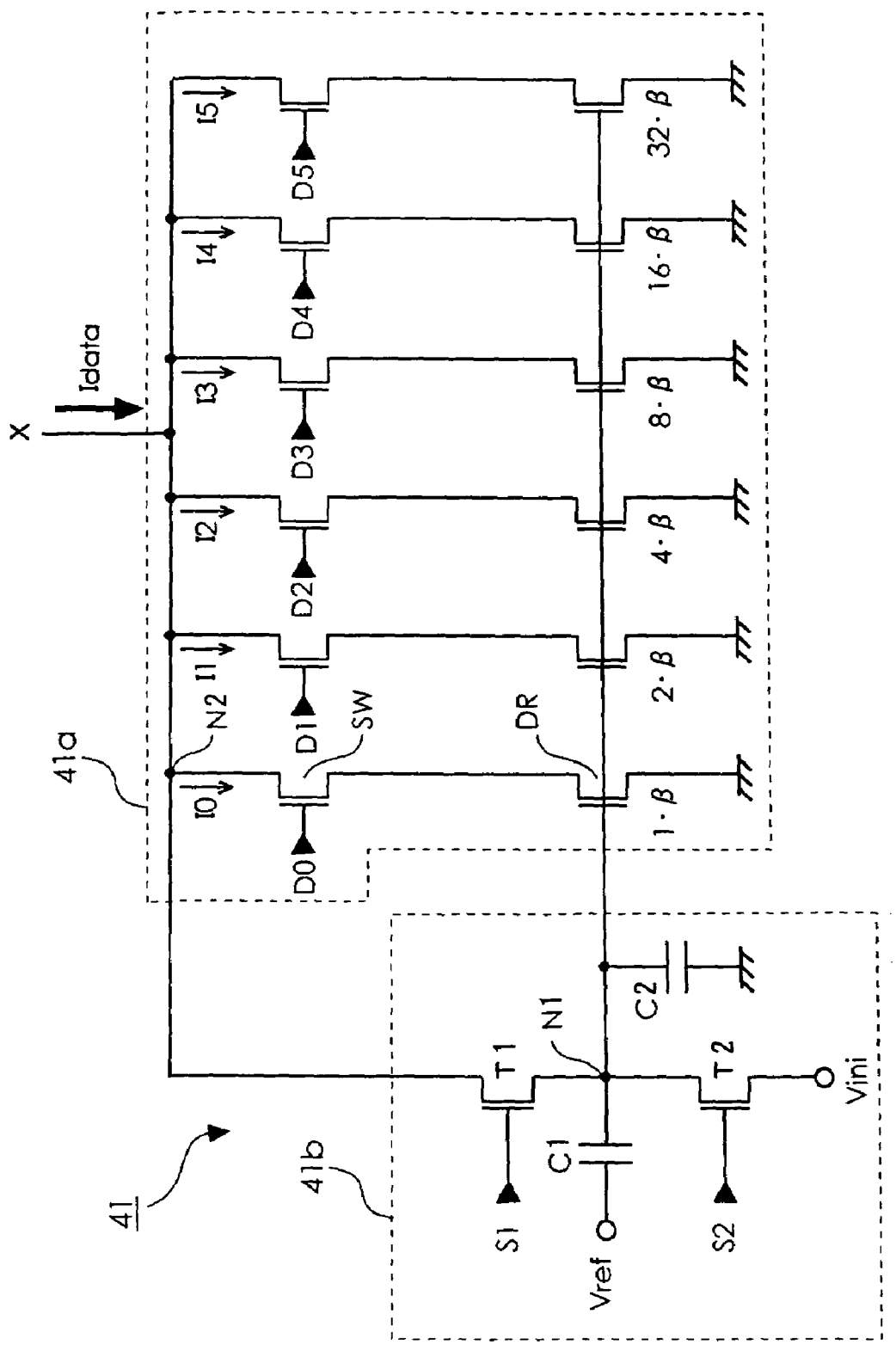
FIG. 4 is a circuit diagram of a current generation circuit 41 according to a second embodiment.

FIG. 4 is a circuit diagram of the current generation circuit 41 according to this embodiment. The current generation circuit 41 according to this embodiment differs from the configuration shown in FIG. 2 is that each one of the terminals of six switching elements SW is commonly connected to the second node N2 to which the other terminal of the first transistor T1 is connected. In other words, the feature is that the other terminal of the first transistor T1 is commonly connected via the switching element SW to each one of the terminals of all the driving elements DR in the circuit systems of the bits D0 to D5. Since the remaining construction is the same as the configuration of FIG. 2, the same reference numerals are given, and descriptions thereof are omitted here.

Figure 5:
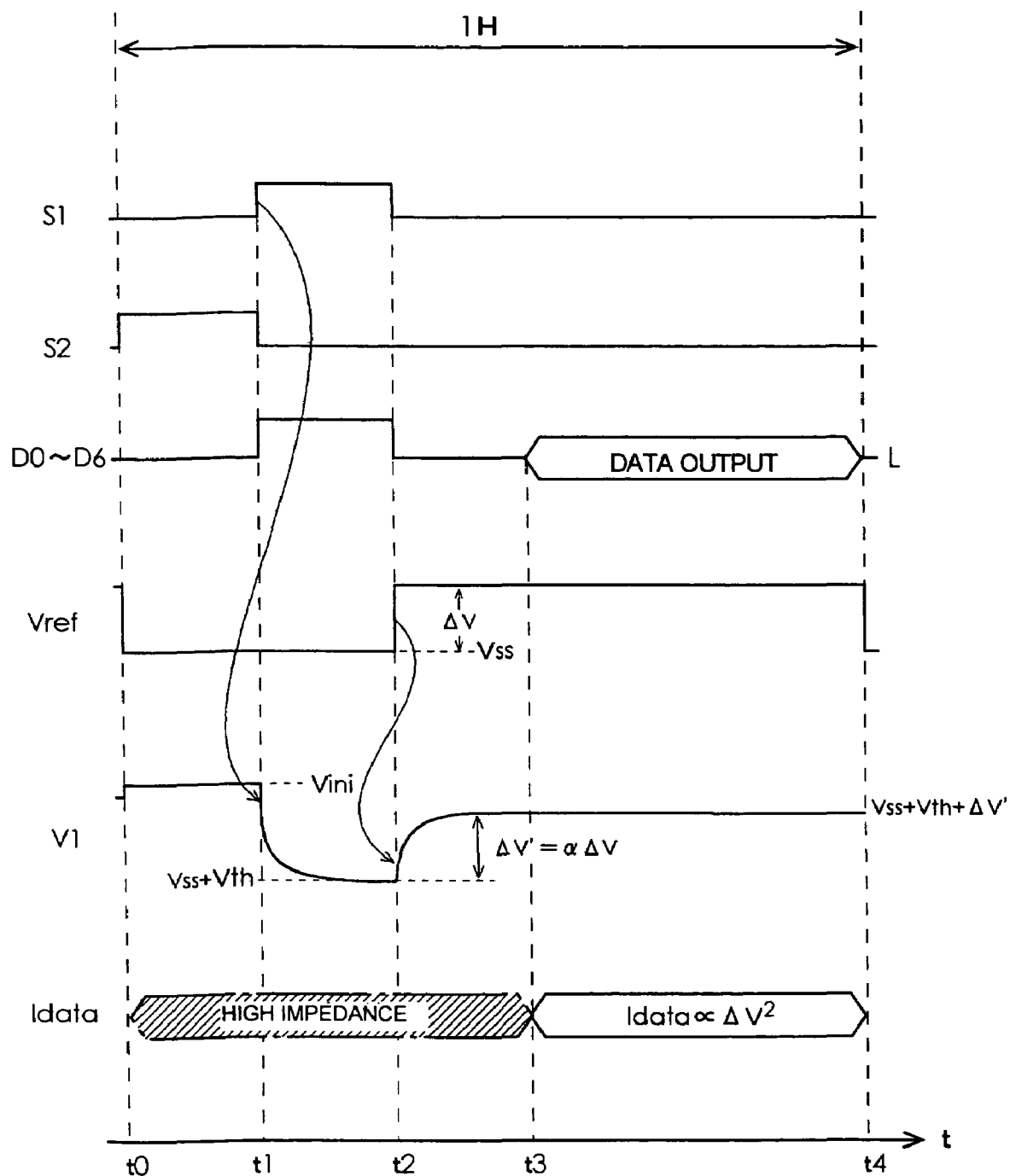
FIG. 5 is an operation timing chart of the current generation circuit according to the second embodiment.

FIG. 5 is an operation timing chart of the current generation circuit 41 shown in FIG. 4. In the configuration of FIG. 4, the diode connection of six driving elements DR is formed simultaneously by turning on not only the first transistor T1, but also six switching elements SW. For this reason, in the offset voltage setting period of t1 to t2 in which diode connection should be formed, in addition to that the first control signal S1 is set to an H level, the data D0 to D5 is also set forcedly to an H level. In this case, the offset voltage (Vss+Vth) that appears on the first node N1 is set in such a manner as to be dependent on Vth which is the lowest among those of the six driving elements DR. Regarding all the driving elements DR contained in the current generation circuit 41, on the assumption that variations of Vth of them are small, Vth compensation of the driving element DR can be performed even in the case of such circuit configuration. Since the remaining operation is the same as the operation of FIG. 3, descriptions thereof are omitted here.

According to this embodiment, the same advantages as those of the first embodiment are provided, and the discharge of charge in the process of setting the offset voltage (Vss+Vth) is performed by using all the driving elements DR. Thus, it becomes possible to perform this process in a short time.

In each of the above-described embodiments, an electro-optical device incorporating an organic EL element is described as the electro-optical element contained in the pixel 2. However, the present invention is not restricted to this device, and can be widely applied to various kinds of electro-optical devices, such as optical communication devices in which a field emission display (FED), an LED display, an organic EL, or an LED is used as the light source, and optical printer heads in which an organic EL or an LED is used as the light source.

In addition, the electro-optical device according to each of the above-described embodiments can be implemented in various electronic devices, including, for example, a mobile computer, a cellular phone, a viewer, a portable game device, an electronic book, a video camera, a digital still camera, a car navigation device, a car stereo, a driving operation panel of a machine tool, a transportation vehicle, etc., a personal computer, a printer, a scanner, a POS, a television receiver, a facsimile device with video player display function, a display section of an electronic guidance board, etc. If the above-described electro-optical device is implemented in these electro-optical devices, the product value of the electronic device can be improved even more, and the product appeal of the electronic device in the market can be improved.

What is claimed is:

1. A current generation circuit comprising:
   a current output section that has circuit systems in which driving elements having respective gain coefficients corresponding to respective weights of bits of input data and switching elements which are on-off controlled according to a content of said bits are connected in series, a number of the circuit systems corresponding to a number of the bits of said input data, respective gates of said driving elements being commonly connected to a predetermined node, and that outputs a data current such that electrical currents flowing through respective channels of said driving elements are merged in a state in which a voltage of said node is set to a driving voltage; and a gate voltage generation section for setting the voltage of said node to an offset voltage corresponding to a threshold voltage of said driving elements by diode-connecting at least one of said driving elements and for setting the voltage of said node to said driving voltage, in which said offset voltage is used as a reference, by varying a voltage supplied to a terminal of a capacitor, the capacitor having another terminal connected to said node;

wherein said gate voltage generation section comprises a first transistor, provided between said node and one of the terminals of said at least one driving element, the first transistor being on-off controlled for diode-connecting said at least one driving element; and wherein said gate voltage generation section further comprises a second transistor provided between said node and a terminal to which an initial voltage having a voltage level higher than said threshold voltage is supplied, the second transistor being turned on before the voltage of said node is set to said offset voltage.

2. The current generation circuit according to claim 1, wherein one of the terminals of said first transistor is connected to said node, and the other terminal of said first transistor is connected to the junction point of one of the terminals of said at least one driving element and said switching element in one of said circuit systems.

3. The current generation circuit according to claim 1, wherein said gate voltage generation section comprises another capacitor, connected to said node, for holding the voltage of said node.

4. An electro-optical device comprising:
a plurality of scanning lines;
a plurality of data lines;
a display section composed of a plurality of pixels provided so as to correspond to the intersections of said scanning lines and said data lines, each of said plurality of pixels including a capacitor in which data corresponding to data current is written; a transistor for setting driving current corresponding to the data held in said capacitor; and an electro-optical element which is set to luminance corresponding to said driving current;

a scanning-line driving circuit for selecting said scanning line corresponding to a pixel to which data is to be written by outputting a scanning signal to said scanning line; and a data-line driving circuit, which cooperates with said scanning-line driving circuit, for outputting said data current to said data line corresponding to said pixel to which data is to be written, wherein, in said data-line driving circuit, said current generation circuit according to claim 1 is provided for each of said data lines.

5. An electronic device incorporating the electro-optic device according to claim 4.

6. A current generation circuit comprising:
a current output section that has circuit systems in which driving elements having respective gain coefficients corresponding to respective weights of bits of input data and switching elements which are on-off controlled according to a content of said bits are connected in series, a number of the circuit systems corresponding to a number of the bits of said input data, respective gates of said driving elements being commonly connected to a predetermined node, and that outputs a data current such that electrical currents flowing through respective channels of said driving elements are merged in a state in which a voltage of said node is set to a driving voltage; and a gate voltage generation section for setting the voltage of said node to an offset voltage corresponding to a threshold voltage of said driving elements by diode-connecting at least one of said driving elements and for setting the voltage of said node to said driving voltage, in which said offset voltage is used as a reference, by varying a voltage supplied to a terminal of a capacitor, the capacitor having another terminal connected to said node;

wherein said gate voltage generation section comprises a transistor, and one of terminals of said transistor is connected to said node, and another terminal of said transistor is connected commonly to each one of terminals of said driving elements.

* * * * *